(12) United States Patent
Yoshida

(10) Patent No.: US 7,157,354 B2
(45) Date of Patent: Jan. 2, 2007

(54) METHOD FOR GETTERING TRANSITION METAL IMPURITIES IN SILICON CRYSTAL

(75) Inventor: Hiroshi Yoshida, Osaka (JP)

(73) Assignee: Japan Science and Technology Agency, Saitama (JP)

( * ) Notice: Subject to any disclaimer, the term of this patent is extended or adjusted under 35 U.S.C. 154(b) by 41 days.

(21) Appl. No.: 10/501,080

(22) PCT Filed: Jan. 9, 2003

(86) PCT No.: PCT/JP03/00139

§ 371 (c)(1),
(2), (4) Date: Dec. 14, 2004

(87) PCT Pub. No.: WO03/060981

PCT Pub. Date: Jul. 24, 2003

(65) Prior Publication Data

US 2005/0090079 A1    Apr. 28, 2005

(30) Foreign Application Priority Data

Oct. 1, 2002   (JP) ............................. 2002-003896

(51) Int. Cl.
*H01L 21/322*   (2006.01)
*H01L 21/4763*  (2006.01)
*B32B 15/00*    (2006.01)
*B32B 17/06*    (2006.01)

(52) U.S. Cl. .................. 438/473; 438/631; 428/432
(58) Field of Classification Search .............. 438/473
See application file for complete search history.

(56) References Cited

U.S. PATENT DOCUMENTS 6,277,501 B1   8/2001   Fujikawa

2001/0012686 A1   8/2001   Hamada

FOREIGN PATENT DOCUMENTS

EP   419 044    3/1991
EP   0 502 471  9/1992

(Continued)

OTHER PUBLICATIONS

C. Maddalon-Vinante et al.; Journal of the Electrochemical Society, vol. 142, No. 2, pp. 560-564, Feb. 1995. Cited in the int'l. search report.

(Continued)

*Primary Examiner*—Chuong Anh Luu
(74) *Attorney, Agent, or Firm*—Westerman, Hattori, Daniels & Adrian, LLP.

(57) ABSTRACT

Disclosed is a method for gettering a transition metal impurity diffused in a silicon crystal at ultra high-speeds to form deep impurity levels therein. The method comprises codoping two kinds of impurities: oxygen and carbon, into silicon, and thermally annealing the impurity-doped silicon to precipitate an impurity complex of an atom of the transition metal impurity, the C and the O, in the silicon crystal, so that the transition metal impurity is confined in the silicon crystal to prevent the ultra high-speed diffusion of the transition metal impurity and electrically deactivate deep impurity levels to be induced by the transition metal impurity. The present invention makes it possible to produce a silicon semiconductor device free of adverse affects from a transition metal impurity, such as Co, Ni or Cu, mixed in a silicon crystal during a process of forming the silicon single crystal, or such as Cu mixed in a silicon wafer during a process of printing a Cu wiring, which has not been able to be completely eliminated from the silicon crystal through conventional techniques.

3 Claims, 5 Drawing Sheets

FOREIGN PATENT DOCUMENTS

| | | |
|---|---|---|
| JP | EP0502471 A2 * | 3/1992 |
| JP | 10-041311 | 2/1998 |
| JP | 11-204534 | 7/1999 |

OTHER PUBLICATIONS

M. Nakamura, Applied Physics Letters, vol. 79, No. 18, pp. 2904-2906; Oct. 29, 2001.

M. Nakamura, Journal of the Electrochemical Society, vol. 147, No. 2, pp. 796-798, 2000.

Patent Abstracts of Japan, Pub. No. 10-303430 of Nov. 13, 1998. Cited in the specification.

Patent Abstracts of Japan, Pub. No. 2001-250957 of Sep. 14, 2001. Cited in the spec.

Patent Abstracts of Japan, Pub. No. 2001-274405 of Oct. 5, 2001. Cited in the spec.

* cited by examiner

METHOD FOR GETTERING TRANSITION METAL IMPURITIES IN SILICON CRYSTAL

CROSS-REFERENCE TO RELATED APPLICATION

This application is a 371 of PCT/JP03/00139 Jan. 9, 2003.

TECHNICAL FIELD

The present invention relates to a method for deactivating a transition metal impurity, such as Co, Ni or Cu, which is released from row materials during a process of forming a silicon single crystal and mixed in the crystal as a solid solution, or such as Cu which is mixed in a silicon wafer during a process of printing a Cu wiring, to produce a silicon semiconductor device free of deep impurity levels.

BACKGROUND ART

Based on high-density integration using nano-processing techniques, silicon semiconductor devices serve as the backbone of current information-driven society. In connection with the existing need for higher operation speed and higher-density integration in silicon semiconductor devices, the contact resistance between wirings becomes a critical factor dominating the operational limit of these devices.

Heretofore, an aluminum thin wire has been used as a wiring material for highly integrated silicon semiconductor devices. However, a thinner wire required for the high-density integration and ultra-miniaturization of silicon semiconductor devices inevitably has higher resistivity and contact resistance, and resulting increased heat generation causes deterioration in durability of the devices which hinders higher-density integration. In this context, a technique of reducing the resistance using a copper (Cu) thin wire has been developed and actually used in a part of CPUs.

During a semiconductor forming process and a wiring printing process using lithography, Cu atoms are mixed in a silicon device through diffusion to form a deep impurity level in the bandgap of a silicon crystal. Moreover, the Cu atoms are incorporated in the silicon crystal through ultra high-speed diffusion to form deep impurity levels all over the silicon crystal, which are likely to serve as a carrier killer or cause dielectric breakdown. Consequently, in the existing circumstances, the devices using Cu thin wires have poor process yield.

While a transition metal impurity, particularly Co, Ni or Cu, which is released from raw materials during the formation of a silicon-single-crystal through a Czochralski crystal pulling process or the like and mixed in the crystal as a solid solution, is insignificant if the device has a relatively large size, even a small amount of transition metal impurity residing in the device has a great impact on the quality and process yield of the device in the present circumstances where the device is ultra-miniaturized in conjunction with the need for high densification.

In view of these situations, there has been employed a method, so-called gettering, for eliminating a transition metal impurity which is contained in a wafer subject to device processing and likely to serve as a carrier killer, or for confining the transition metal impurity at a position away from a surface for use in device processing to immobilize it during heat treatment or device processing (for example, the following Patent Publications 1, 2 and 3)

Patent Publication 1: Japanese Patent Laid-Open Publication No. 10-303430

Patent Publication 2: Japanese Patent Laid-Open Publication No. 2001-250957

Patent Publication 3: Japanese Patent Laid-Open Publication No. 2001-274405

However, these conventional techniques have difficulties in producing the device while completely eliminating any transition metal impurity defused at ultra high-speeds to form deep impurity levels. Thus, in the production process of silicon semiconductor devices, it is an essential factor to solve this problem.

DISCLOSURE OF INVENTION

The present invention is fundamentally directed to a method for gettering a transition metal impurity diffused in a silicon wafer at ultra high-speeds to form deep impurity levels therein, particularly Co, Ni or Cu which is diffused at ultra high-speeds under a room temperature. In this method, two kinds of impurities consisting of oxygen (O) and carbon (C) are codoped into silicon, and then the impurity-doped silicon is thermally annealed to form an impurity complex comprising the C, the O and the transition metal impurity, at a specific atomic position in the silicon crystal, so as to produce a silicon semiconductor device free of adverse affects from the transition metal impurity.

A chemical bonding energy in the impurity complex formed in this manner can confine the transition metal impurity in the impurity complex, and electrically deactivate deep impurity levels to be induced by the transition metal impurity. Thus, even if a transition metal impurity, such as Co, Ni or Cu, mixed during a silicon-single-crystal forming process, or Cu mixed during a Cu-wiring printing process, exists in a silicon crystal, a silicon semiconductor device free of deep impurity levels in the bandgap of the silicon crystal can be produced.

More specifically, the present invention provides a method for gettering a transition metal impurity diffused in a silicon crystal at ultra high-speeds to form deep impurity levels therein. This method comprises the steps of codoping two kinds of impurities consisting of oxygen (O) and carbon (C), into silicon, and thermally annealing the impurity-doped silicon to precipitate an impurity complex comprising an atom of the transition metal impurity, the C and the O, in the silicon crystal, so that the transition metal impurity is confined in the silicon crystal to prevent the ultra high-speed diffusion of the transition metal impurity and electrically deactivate deep impurity levels to be induced by the transition metal impurity.

In the above method of the present invention, the transition metal impurity may be at least one selected from the group consisting of Co, Ni and Cu which are released from a raw material during a process of forming a silicon single crystal and mixed in the silicon crystal, and Cu which is mixed in a silicon wafer during a process of printing a Cu wiring.

The codoping step may include codoping oxygen (O) in a natural manner and carbon (C) in an artificial manner, or both oxygen (O) and carbon (C) in an artificial manner, into a silicon melt during a silicon single crystal growth through a Czochralski crystal pulling process.

Alternatively, the codoping step may include ion-injecting an oxygen ion and a carbon ion into a silicon wafer to codope both oxygen (O) and carbon (C) in an artificial manner, into the silicon wafer.

A transition metal diffused at ultra high-speeds through an interstitial position in a silicon crystal, particularly Co, Ni or Cu impurity, forms deep impurity levels in the bandgap of the crystal, to capture carriers from an acceptor and/or donor of p-type and n-type silicon crystals so as to cause significant deterioration in device functions.

As one example, a sample in which Cu is diffused in a wafer (1 Ωcm) formed of a low-resistance n-type silicon single crystal was prepared by doping Cu into the wafer through an ion injection process to form deep impurity levels in the bandgap so as to provide a high resistance (10 KΩcm) to the wafer. As seen from the measurement result of diffusion coefficients of Cu and Ni in FIG. 1, Cu and Ni are diffused at ultra high speeds having a greater digit number of 10 or more, as compare to that of a Si atom in the silicon crystal or a p-donor impurity in the silicon crystal. By way of comparison, FIG. 1 also shows the temperature dependences of respective diffusion coefficients of the Si atom in the silicon crystal and the donor impurity in the silicon crystal.

Through the above data, it was verified that Cu doped in a silicon single crystal forms deep impurity levels in the bandgap while being diffused at ultra high-speeds. Further, it was experimentally proved that the diffusion barrier of a Cu impurity in a silicon crystal is in an extremely shallow level of 0.18 to 0.35 eV, and the Cu impurity can be diffused even at a room temperature.

BEST MODE FOR CARRYING OUT THE INVENTION

The present invention is directed to a method for gettering a transition metal impurity in a silicon crystal, comprising codoping two kinds of impurities consisting of oxygen (O) and carbon (C), into silicon, and then thermally annealing the impurity-doped silicon.

The codoping may be achieved by introducing oxygen or carbon into a silicon melt during the course of forming a silicon crystal through a Czochralski crystal pulling process to be performed in advance of the preparation of a silicon wafer. While oxygen is generally introduced from surrounding air naturally or in a natural manner, its concentration should be controlled. Thus, both oxygen (O) and carbon (C) are preferably codoped artificially or in an artificial manner while controlling the concentration thereof. The oxygen (O) and carbon (C) may be codoped into a silicon wafer in an artificial manner through an ion injection process. The codoped oxygen (O) and carbon (C) is set at a concentration equal to or greater than that of the transition metal impurity, for example, in the range of about $10^{15}$ to $10^{19}$ $cm^{-3}$.

If a carbon (C) atom is doped in an artificial manner at a Si-substituting position in a silicon crystal, a strain field with long-range interactions will be formed because the carbon (C) atom has an atomic radius less than that of a silicon (Si) atom. The oxygen (O) doped into a silicon crystal in a natural manner or in an artificial manner through a Czochralski crystal growth process, or the oxygen (O) doped into a silicon crystal in an artificial manner through an ion injection process, gets at an interstitial position of the silicon bond.

Figure 1:
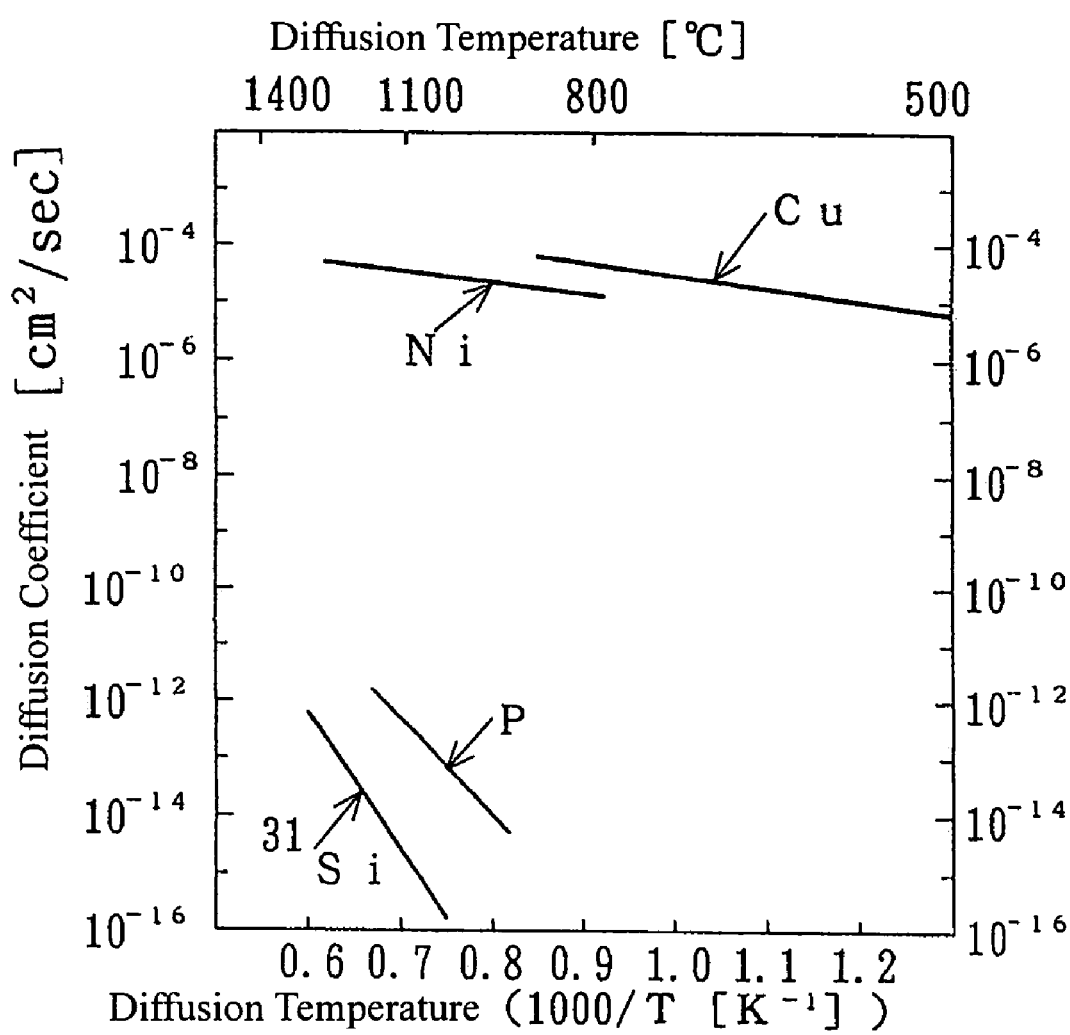
FIG. 1 is a graph showing the temperature dependences of respective diffusion coefficients of Ni and Cu in a silicon crystal.
Figure 2:
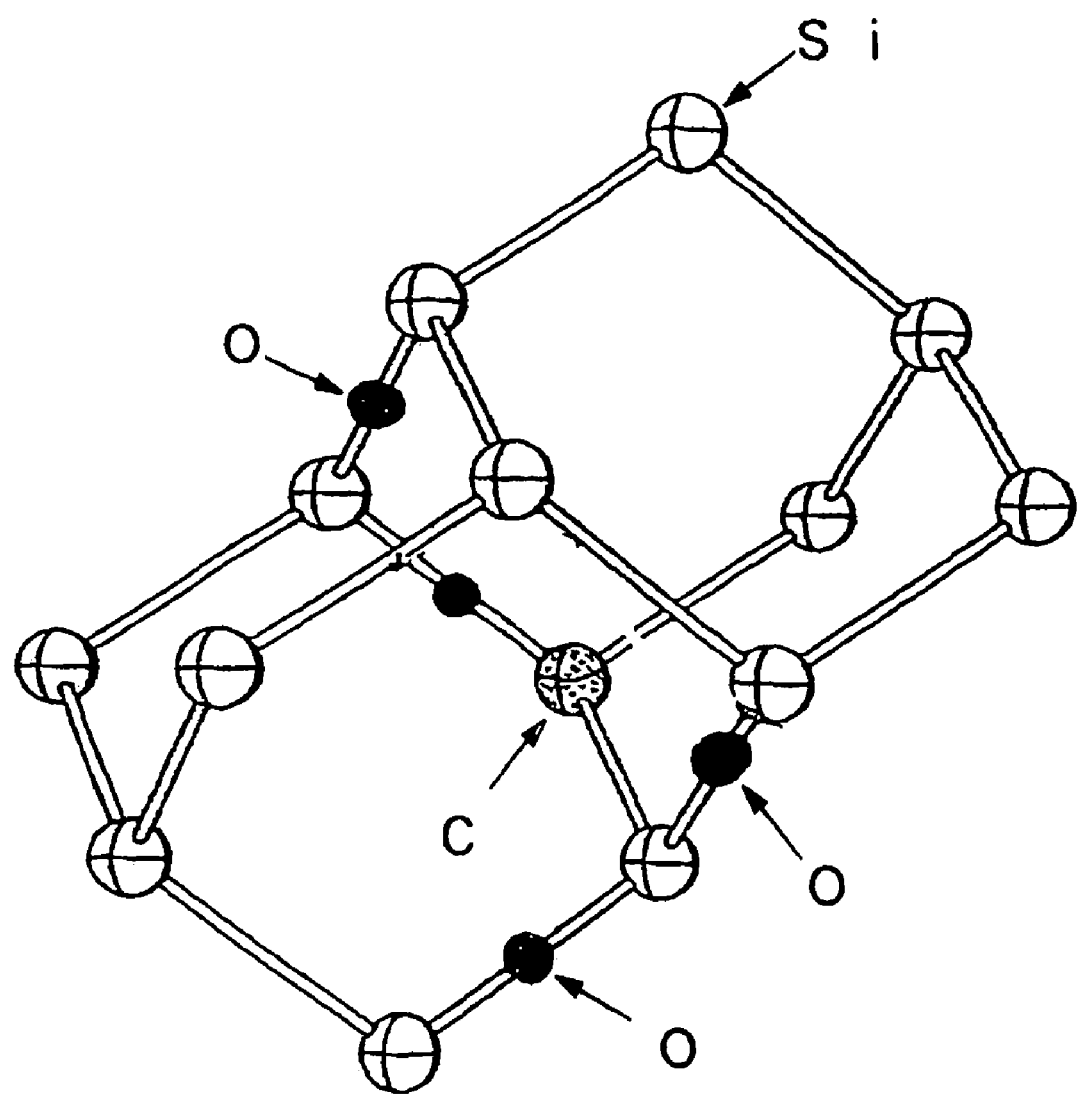
FIG. 2 is a schematic diagram showing the structure of a C—O impurity complex in a silicon crystal, which is formed through a Czochralski crystal growth process.

Then, the silicon crystal containing the two kinds of doped C and O is subjected to a thermal annealing treatment. For example, the thermal annealing treatment is performed by placing a silicon wafer in an electric furnace, and heating under a nitrogen gas or argon gas atmosphere at a temperature of 250° C. or more, preferably at a temperature ranging from about 350 to 500° C. for about 10 minutes to 2 hours. As shown in FIG. 2, through the thermal annealing treatment, O atoms getting at the interstitial position of the silicon bond are collected around a C atom at the Si-substituting position due to the strain field with long-range interactions arising from the C atom. The C atom is located at the central position of the interstitial bond.

Figure 3:
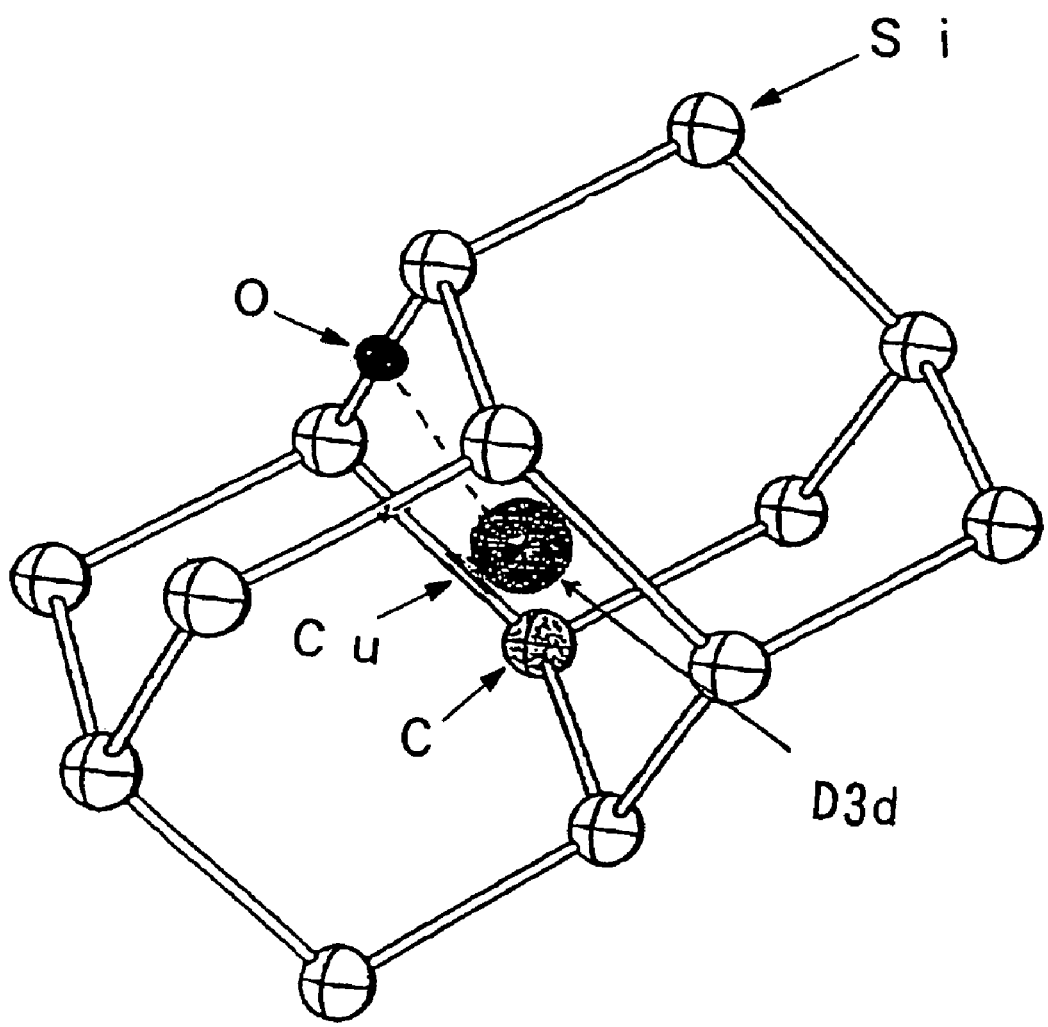
FIG. 3 is a schematic diagram showing the structure of a C—O impurity complex in a silicon crystal, which is experimentally determined through an extended x-ray absorption fine structure (EXAFS) spectroscopy.

Simultaneously, the strain field with long-range interactions in the C atom allows an atom of the transition metal impurity to be weakly drawn to the C atom, so as to form an impurity complex in combination with the O atoms collected around the C atom through the thermal annealing treatment, and precipitate the impurity complex consisting of the transition metal, the C atm and the O atoms, at a specific atomic position in the silicon crystal. The structure of the impurity complex containing the transition metal was experimentally determined through an EXAFS spectroscopy. As a result, it was proved that the impurity complex has a configuration as shown in FIG. 3. The specific atomic position herein means an interstitial position which is located in the vicinity of the carbon (C), and allows the transition metal to be strongly bonded with the oxygen (O) so as to form a compound, as shown in FIG. 3.

Figure 4:
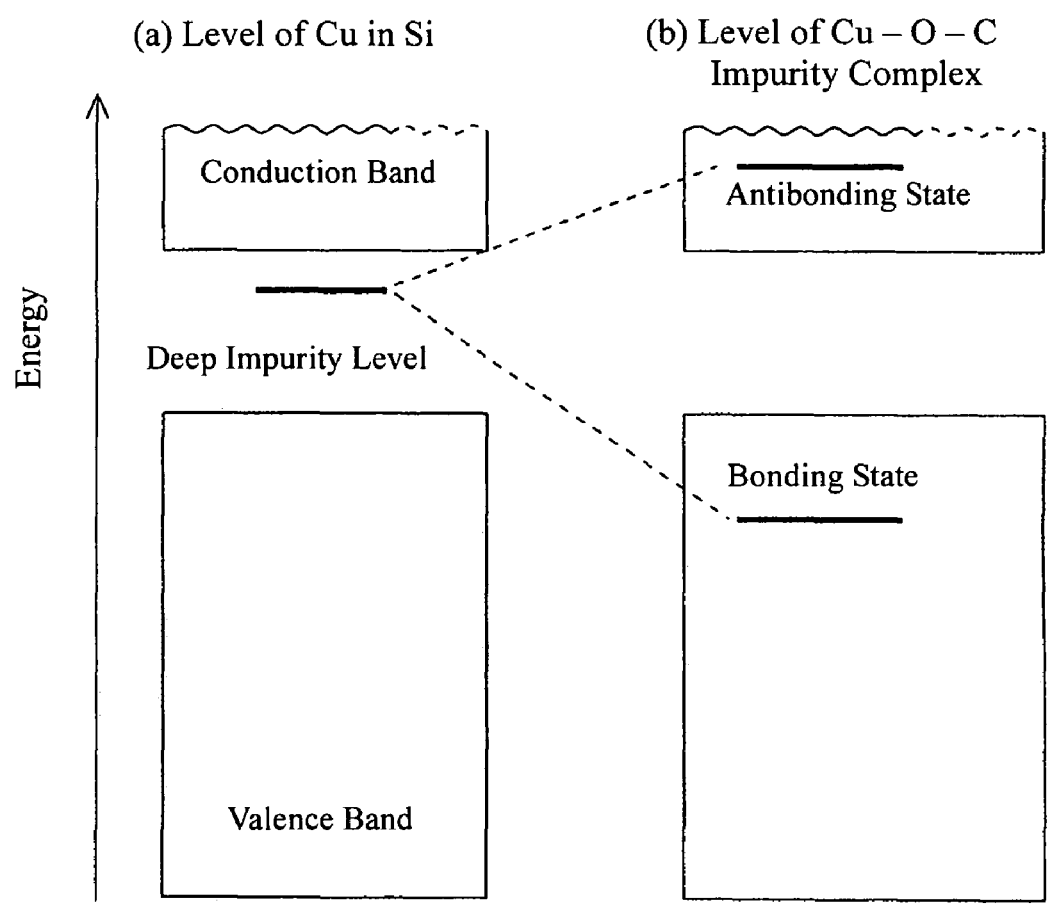
FIG. 4 is an explanatory diagram showing a process in which a deep impurity level (a) of a Cu impurity in a silicon crystal is vanished while splitting into a bonding state in the valence band and an antibonding state in the conduction band, in response to the formation of a Cu—O—C impurity complex, and changed into a Cu—O—C impurity level.

Based on a chemical bonding force in the complex formed of the transition metal impurity and the two kinds of impurities consisting of the oxygen (O) and the carbon (C), the transition metal impurity is confined in the impurity complex. In addition, as illustrated in FIG. 4, according to a strong orbital hybridization of the 3d-orbital of the transition metal and the p-orbitals of the C atom and the O atoms, a deep impurity level is split into a bonding state (in the valence band) and an antibonding state (in the conduction band), and vanished. Thus, the deep impurity level can be electrically deactivated.

Figure 5:
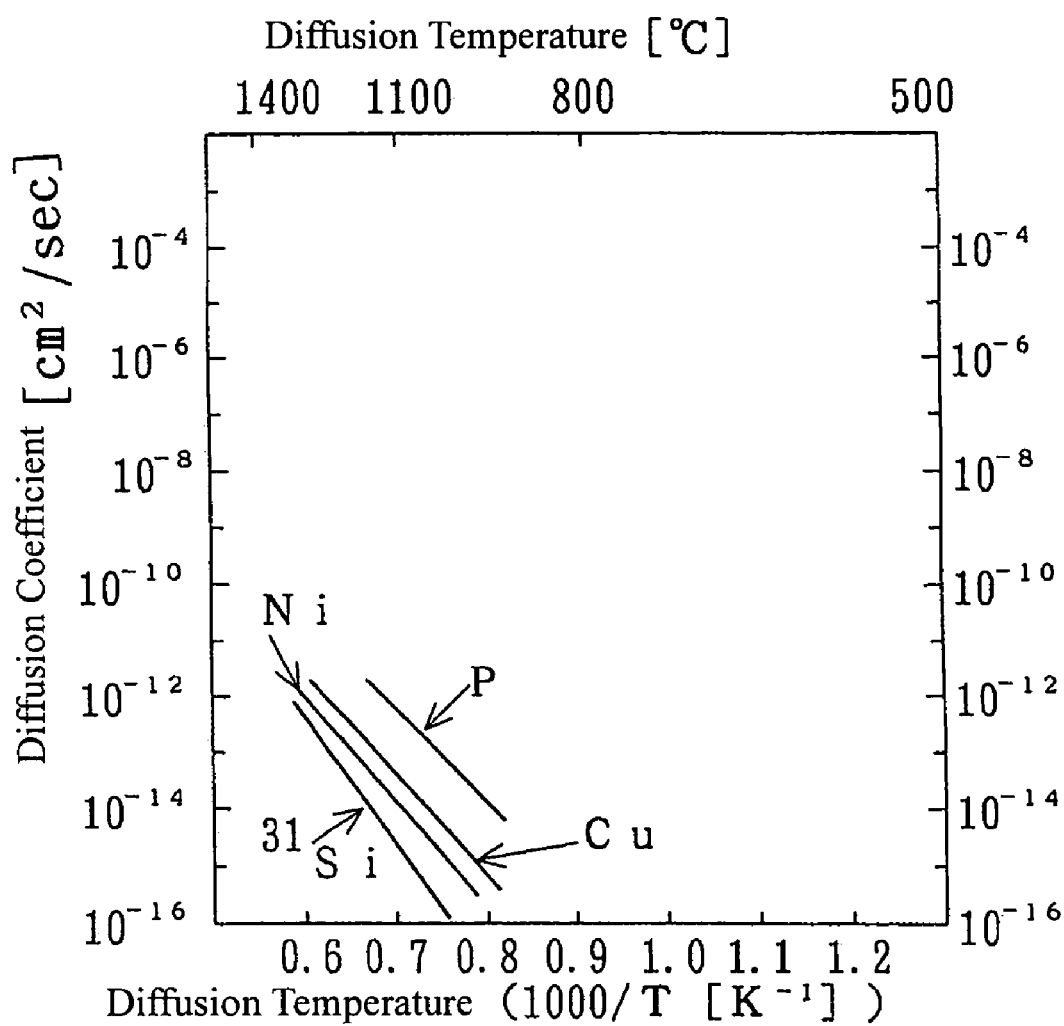
FIG. 5 is a graph showing the temperature dependences of respective diffusion coefficients of Ni and Cu in a silicon crystal, after codoping a C atom and an O atom into the silicon crystal, and then thermally annealing the imparity-doped silicon crystal.

The respective diffusion coefficients of Cu and Ni in this state were measured. As shown in FIG. 5, the diffusion coefficients have a reduced digit number of about 8 to 9, and exhibit almost no diffusion. By way of comparison, FIG. 5 also shows the temperature dependences of respective diffusion coefficients of a Si atom in the silicon crystal and a p-donor impurity in the silicon crystal.

According to the method of the present invention, in a process of producing a silicon semiconductor device, the electrical activity and ultra high-speed diffusion of a transition metal impurity can be controlled by a simple thermal annealing treatment during the device production process. Thus, it is expected to provide a drastic effect on achieving a high-speed and energy-saving operation, which is advantageous to silicon semiconductor industries.

In addition, such a production process technology can be used for accelerating high-speed operation, high-densification and/or energy saving in all devices using a silicon crystal. Thus, this technology has extremely wide application, and can serve as one basic technical factor industrially essential for silicon device productions in the future.

EXAMPLE 1

The codoping of oxygen (O) and carbon (C) in a silicon crystal, the anti-diffusion of a Cu impurity through a thermal annealing treatment and the deactivation of a deep impurity level will be described in connection with a specific example.

During the course of performing crystal growth through a crystal pulling process using a Czochralski crystal pulling apparatus, oxygen (O) and carbon (C) were codoped into a silicon melt. Through this process, a low-resistance n-type silicon single crystal doped with the oxygen (O) and carbon (C) at a concentration of $8 \times 10^{18}$ cm$^{-3}$ which is equal to or greater than that of a copper impurity was obtained. A wafer obtained from this single crystal had an electrical resistivity of 1 Ωcm. In order to prepare a sample analogous to a wafer containing a copper impurity mixed therein during a Cu-wiring printing process, Cu was doped into the above wafer at a concentration of $4 \times 10^{18}$ cm$^{-3}$ through an ion injection process. Then, the wafer was placed in an electric furnace, and thermally annealed under an argon atmosphere at each of temperatures of 100° C., 200° C., 300° C., 350° C., 400° C. and 500° C., for 16 minutes.

The electrical resistivity of the wafer after the thermal annealing treatment was measured. As shown in Table 1, in case of the thermal annealing treatment at a temperature of 350° C. or more, the electrical resistivity of the wafer was not substantially changed from 1 Ωcm. A wafer subjected to no thermal annealing treatment (annealing temperature—in Table 1) has a resistivity of 8569 Ωcm. In view of these data, it was verified that deep impurity levels due to the doped Cu are vanished by the codoping of the oxygen and carbon and the thermal annealing treatment.

TABLE 1

| | annealing temperature | | | | | | |
|---|---|---|---|---|---|---|---|
| | — | 100 | 200 | 300 | 350 | 400 | 500 |
| resistivity after annealing for 16 minutes (Ωcm) | 8569 | 367 | 58.0 | 9.60 | 1.02 | 0.98 | 0.67 |

INDUSTRIAL APPLICABILITY

According to the present invention, the electrical activity and ultra high-speed diffusion in deep impurity levels of a transition metal impurity, such as Co, Ni or Cu, can be controlled by a simple treatment during a device production process. Thus, it is expected to provide a drastic effect on achieving a high-speed and energy-saving operation, which is advantageous to silicon semiconductor industries. The present invention can contribute to provide high-performance silicon semiconductor devices.

What is clamied is:

1. A method for gettering a transition metal impurity diffused in a silicon crystal at ultra high-speeds to form deep impurity levels therein, said method comprising the steps of:

codoping two kinds of impurities consisting of oxygen (O) and carbon (C), into silicon at a concentration equal to or greater than that of at least one transition metal impurity selected from the group consisting of Co, Ni and Cu which are released from a raw material during a process of forming a silicon single crystal and mixed in said silicon crystal, and Cu which is mixed in a silicon wafer during a process of printing a Cu wiring; and thermally annealing said impurity-doped silicon by a single heating, the single heating being in a temperature range from 250° C. to 500° C. to form a transition metal-O—C complex comprising an atom of said transition metal impurity, said C and said O, so as to precipitate said impurity complex at an interstitial position in said silicon crystal, whereby said transition metal impurity is confined in said silicon crystal to prevent the ultra high-speed diffusion of said transition metal impurity and electrically deactivate deep impurity levels to be induced by said transition metal impurity.

2. The method as defined in claim 1, wherein said codoping step includes codoping oxygen (O) in a natural manner and carbon (C) in an artificial manner, or both oxygen (O) and carbon (C) in an artificial manner, into a silicon melt during a silicon single crystal growth through a Czochralski crystal pulling process.

3. The method as defined in claim 1, wherein said codoping step includes ion-injecting an oxygen ion and a carbon ion into a silicon wafer to codope both oxygen (O) and carbon (C) in an artificial manner, into said silicon wafer.

* * * * *